United States Patent
Nath et al.

(10) Patent No.: US 12,432,910 B2
(45) Date of Patent: Sep. 30, 2025

(54) ELECTRICALLY PROGRAMMABLE FUSE OVER LATERAL BIPOLAR TRANSISTOR

(71) Applicant: GlobalFoundries U.S. Inc., Malta, NY (US)

(72) Inventors: Anindya Nath, Essex Junction, VT (US); Ephrem G. Gebreselasie, South Burlington, VT (US); Rajendran Krishnasamy, Essex Junction, VT (US); Alain F. Loiseau, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 358 days.

(21) Appl. No.: 17/895,156

(22) Filed: Aug. 25, 2022

(65) Prior Publication Data

US 2024/0074167 A1    Feb. 29, 2024

(51) Int. Cl.
*H10B 20/20* (2023.01)
*H01L 23/525* (2006.01)
*H10D 10/60* (2025.01)

(52) U.S. Cl.
CPC ......... *H10B 20/20* (2023.02); *H01L 23/5256* (2013.01); *H10D 10/60* (2025.01)

(58) Field of Classification Search
None
See application file for complete search history.

(56) References Cited

U.S. PATENT DOCUMENTS

| | | | | |
|---|---|---|---|---|
| 4,760,433 A | * | 7/1988 | Young | H01L 21/8249 257/370 |
| 5,493,149 A | * | 2/1996 | Jerome | H01L 21/8249 257/E27.102 |
| 5,661,323 A | * | 8/1997 | Choi | H01L 23/5256 365/177 |
| 10,127,992 B2 | | 11/2018 | Chung | |
| 11,088,072 B2 | | 8/2021 | Hall et al. | |
| 11,848,324 B2 | | 12/2023 | Gebreselasie et al. | |
| 2010/0252860 A1 | * | 10/2010 | Yang | H10D 10/60 257/E29.187 |
| 2013/0308366 A1 | | 11/2013 | Chung | |
| 2014/0151852 A1 | * | 6/2014 | Adkisson | H01L 29/0649 438/359 |
| 2021/0104460 A1 | * | 4/2021 | Allman | H01L 23/562 |
| 2023/0326919 A1 | * | 10/2023 | Chiu | H01L 27/0259 257/303 |

OTHER PUBLICATIONS

Sumida et al., A Lateral Insulated Gate Bipolar Transistor Structure with the Collector-Short Region for Improved Latch-Up Performance, 1996 Jpn. J. Appl. Phys. 35 L198, (Year: 1996).*

* cited by examiner

*Primary Examiner* — Sue A Purvis
*Assistant Examiner* — Fakeha Sehar
(74) *Attorney, Agent, or Firm* — Francois Pagette; Hoffman Warnick LLC

(57) ABSTRACT

Embodiments of the disclosure provide a circuit structure including an electrically programmable fuse (efuse) and lateral bipolar transistor. A structure of the disclosure includes a lateral bipolar transistor within a semiconductor layer and over a substrate. An insulator layer is over a portion of the semiconductor layer. An efuse structure is within a polycrystalline semiconductor layer and over the insulator layer. The efuse structure is over a current path through the lateral bipolar transistor.

17 Claims, 4 Drawing Sheets

ELECTRICALLY PROGRAMMABLE FUSE OVER LATERAL BIPOLAR TRANSISTOR

BACKGROUND

Field of the Invention

The present invention relates to integrated circuits (ICs) and, more particularly, to electrically programmable fuses (efuses) and lateral bipolar transistors.

Description of Related Art

Integrated circuit (ICs) for implementing complex functions may include alternatingly doped semiconductor regions in various configurations. One type of configuration is a "triple well" structure, featuring a doped well instead of a deep well and various shallow wells inside of the well. These wells may have p-type and n-type doping, e.g., to provide opposite polarity metal oxide semiconductor field effect transistors (MOSFETs) in close proximity within a device layer. These features, while favorable for MOSFETs and similar devices, may present drawbacks when used for other types of devices. Electrically programmable fuses ("efuses"), in a triple well structure or similar configuration, require a significantly larger surface area to operate due to the wide variety of doping polarities and concentrations in a device. An efuse is an electrical connection between two nodes that is configured to be destroyed in response to an electrical current, thus creating an open circuit between the two nodes. The effectiveness and reliability of efuses and other device components depend partially on each component's ability to resist or prevent intended degradation from sources other than electrical current, e.g., gradual electromigration degradation.

SUMMARY

All aspects, examples and features mentioned herein can be combined in any technically possible way.

Embodiments of a structure disclosed herein provide a structure including: a lateral bipolar transistor within a semiconductor layer and over a substrate; an insulator layer over a portion of the semiconductor layer; and an electrically programmable fuse (efuse) structure within a polycrystalline semiconductor layer and over the insulator layer, wherein the efuse structure is over a current path through the lateral bipolar transistor, and the insulator layer electrically isolates the efuse structure from the current path.

Another aspect of the disclosure includes any of the preceding aspects, and wherein a separation distance between one of an emitter of the lateral bipolar transistor and a first sidewall of the insulator layer is larger than a separation distance between a collector of the lateral bipolar transistor and a second sidewall of the insulator layer.

Another aspect of the disclosure includes any of the preceding aspects, and wherein the separation distance is between approximately 0.1 micrometers ($\mu m$) and approximately 0.5 $\mu m$.

Another aspect of the disclosure includes any of the preceding aspects, and further including a resistive semiconductor material vertically between the substrate and the semiconductor layer.

Another aspect of the disclosure includes any of the preceding aspects, and wherein an emitter of the lateral bipolar transistor is coupled to one of an anode and a cathode of the efuse structure.

Another aspect of the disclosure includes any of the preceding aspects, and wherein the insulator layer includes a high-k gate dielectric material.

Another aspect of the disclosure includes any of the preceding aspects, and wherein the semiconductor layer includes a monocrystalline semiconductor.

Some embodiments of a structure disclosed herein provide a structure including: a crystalline semiconductor layer over a substrate; a lateral bipolar transistor defined within the crystalline semiconductor layer; an insulator layer over a portion of the crystalline semiconductor layer; a polycrystalline semiconductor layer on the insulator layer; and an electrically programmable fuse (efuse) structure defined within the polycrystalline semiconductor layer and over the insulator layer, wherein a vertical thickness of the insulator layer electrically isolates the efuse structure and the lateral bipolar transistor, and wherein the efuse structure is over a current path through the lateral bipolar transistor Another aspect of the disclosure includes any of the preceding aspects, and wherein a separation distance between one of an emitter of the lateral bipolar transistor and a first sidewall of the insulator layer is larger than a separation distance between a collector of the lateral bipolar transistor and a second sidewall of the insulator layer.

Another aspect of the disclosure includes any of the preceding aspects, and wherein the separation distance is between approximately 0.1 micrometers ($\mu m$) and approximately 0.5 $\mu m$.

Another aspect of the disclosure includes any of the preceding aspects, and further including a resistive semiconductor material vertically between the substrate and the crystalline semiconductor layer.

Another aspect of the disclosure includes any of the preceding aspects, and wherein an emitter of the lateral bipolar transistor is coupled to one of an anode and a cathode of the efuse structure.

Another aspect of the disclosure includes any of the preceding aspects, and wherein the insulator layer includes a high-k gate dielectric material.

Additional embodiments of a structure disclosed herein provide a structure including: a first lateral bipolar transistor within a semiconductor layer and over a substrate; an insulator layer over a portion of the semiconductor layer; a second lateral bipolar transistor within a polycrystalline semiconductor layer and over the insulator layer; and an electrically programmable fuse (efuse) structure within the polycrystalline semiconductor layer and over the insulator layer, wherein a cathode of the efuse structure is adjacent one of an emitter and a collector of the second lateral bipolar transistor, the efuse structure is over a current path through the lateral bipolar transistor, and the insulator layer electrically isolates the efuse structure from the current path.

Another aspect of the disclosure includes any of the preceding aspects, and wherein a separation distance between one of an emitter of the first lateral bipolar transistor and a first sidewall of the insulator layer is larger than a separation distance between a collector of the first lateral bipolar transistor and a second sidewall of the insulator layer.

Another aspect of the disclosure includes any of the preceding aspects, and wherein the separation distance is between approximately 0.1 micrometers ($\mu m$) and approximately 0.5 $\mu m$.

Another aspect of the disclosure includes any of the preceding aspects, and further including a resistive semiconductor material vertically between the substrate and the semiconductor layer.

Another aspect of the disclosure includes any of the preceding aspects, and wherein one of an anode and a cathode of the efuse structure is coupled to each of the first lateral bipolar transistor and the second lateral bipolar transistor.

Another aspect of the disclosure includes any of the preceding aspects, and wherein the insulator layer includes a high-k gate dielectric material.

Another aspect of the disclosure includes any of the preceding aspects, and wherein the semiconductor layer includes a monocrystalline semiconductor.

BRIEF DESCRIPTION OF THE DRAWINGS

The present invention will be better understood from the following detailed description with reference to the drawings, which are not necessarily drawn to scale and in which.

DETAILED DESCRIPTION

Integrated circuit (ICs) for implementing complex functions may include alternatingly doped semiconductor regions in various configurations. One type of configuration is a "triple well" structure, featuring a doped well instead of a deep well and various shallow wells inside of the well. These wells may have p-type and n-type doping, e.g., to provide opposite polarity metal oxide semiconductor field effect transistors (MOSFETs) in close proximity within a device layer. These features, while favorable for MOSFETs and similar devices, may present drawbacks when used for other types of devices. Electrically programmable fuses ("efuses"), in a triple well structure or similar configuration, require a significantly larger surface area to operate due to the wide variety of doping polarities and concentrations in a device. An efuse is an electrical connection between two nodes that is configured to degrade in response to an electrical current, thus creating an open circuit between the two nodes. In triple well structures featuring efuses, the resistance of the open circuit may not be predictable and thus may pose reliability concerns.

Embodiments of the disclosure provide a structure including a lateral bipolar transistor within a semiconductor layer and located over a substrate. An insulator layer is over a portion of the semiconductor layer, and an electrically programmable fuse (efuse) structure is within a polycrystalline semiconductor layer over the insulator layer. The efuse structure is over a current path through the lateral bipolar transistor, and the insulator layer electrically isolates the efuse structure from the current path. During operation, enabling a current flow through the lateral bipolar transistor will apply heat to a fuse link of the efuse, thus destroying the fuse link to prevent continued current flow from anode to cathode of the efuse.

Figure 1:
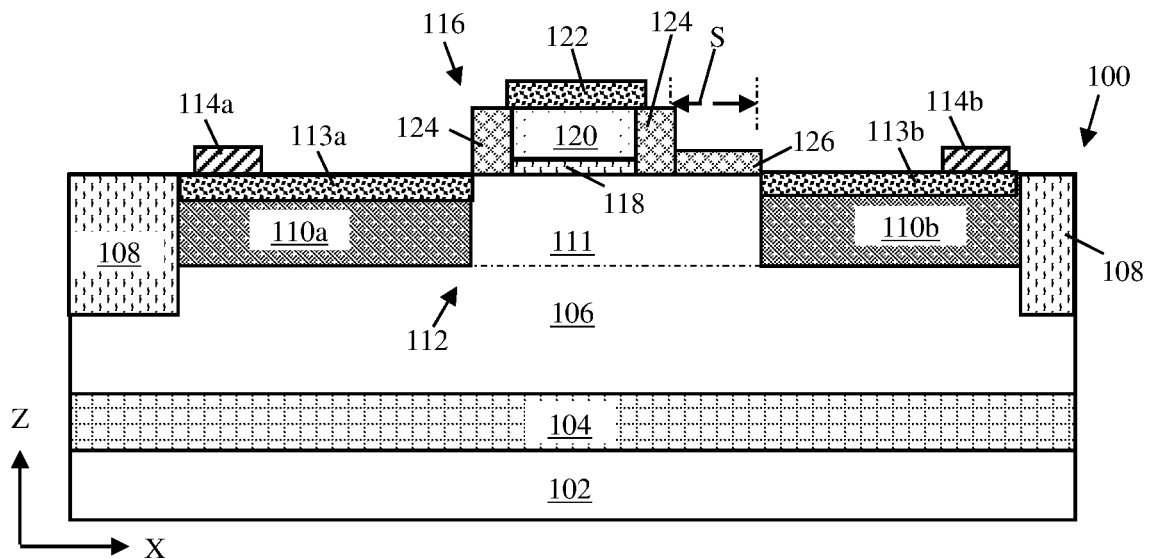
FIG. 1 depicts a first cross-sectional view in plane X-Z of a structure according to embodiments of the disclosure.

FIG. 1 depicts a cross-sectional view of a structure 100 according to embodiments of the disclosure. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various components (e.g., various doped wells, doped semiconductor materials, trench isolation regions, etc.) of structure 100 may be formed above a resistive semiconductor material 104 on substrate 102. Resistive semiconductor material 104 may be formed on or within substrate 102, e.g., by converting a portion of semiconductor material within substrate 102 into a higher-resistive material such as amorphous semiconductor (e.g., a-Si) or polycrystalline semiconductor (e.g., poly-Si). Resistive semiconductor material 104 may extend horizontally throughout substrate 102, and/or may be formed selectively under locations where doped materials are formed, examples of which are discussed elsewhere herein. In further implementations, resistive semiconductor material 104 may include oxygen doping to form a dielectric insulator or a buried oxide ("BOX") layer on substrate 102 to electrically isolate overlying doped semiconductor materials. In further implementations, resistive semiconductor material 104 may include other implanted elements or molecules such as Ge, N, or Si. However embodied, resistive semiconductor material 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive semiconductor material 104, and/or multiple resistive semiconductor materials 104 may be formed within substrate 102 at various positions. Portions of semiconductor material located above resistive semiconductor material 104 may be doped to a predetermined polarity (e.g., lightly doped p-type) and may be identified separately herein as a semiconductor layer 106. Semiconductor layer 106, in some cases, may include a monocrystalline semiconductor. A monocrystalline semiconductor refers to a semiconductor material (e.g., silicon, silicon germanium, etc.) having a single crystallographic orientation throughout its composition. In some cases, such material may be known as a "single crystal semiconductor." In some cases, semiconductor layer 106 may be identified as a "deep well" for distinction from other, more highly doped regions and/or materials formed therein. Semiconductor layer 106 may have the same composition as substrate 102 and may be distinguished from substrate 102 solely based on its position above resistive semiconductor material 104.

Figure 2:
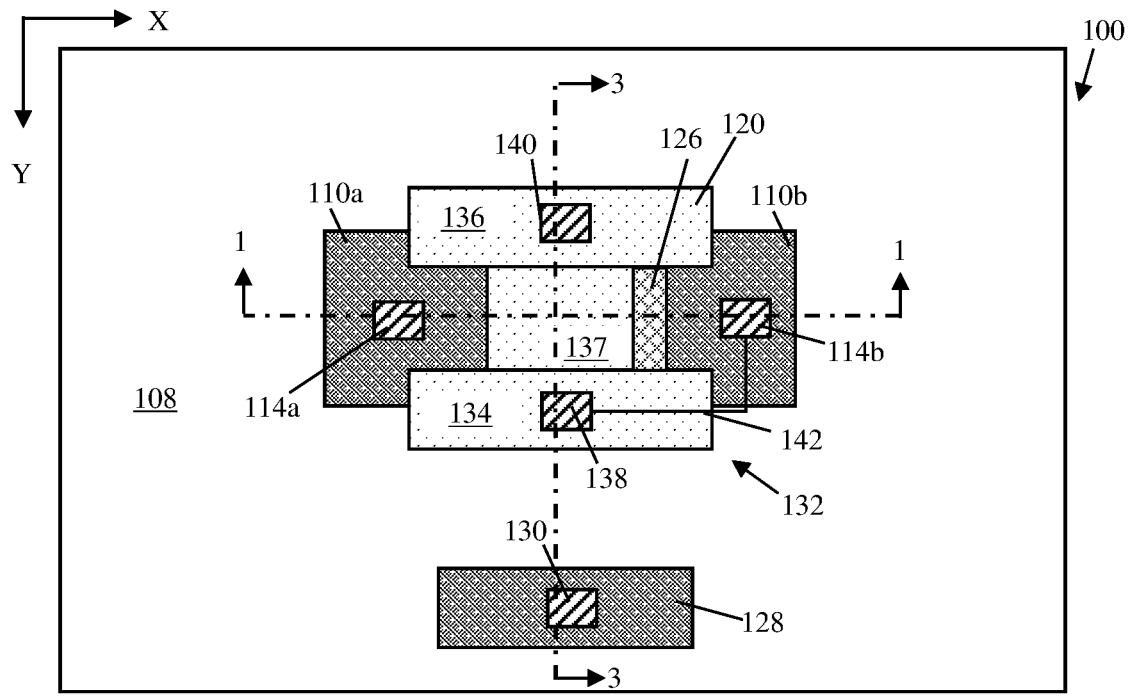
FIG. 2 depicts a plan view in plane X-Y of a structure according to embodiments of the disclosure.

Structure 100 may include one or more trench isolation (TI) regions 108 in respective positions. TI(s) 108 are included in structure 100, e.g., to electrically insulate various conductive and/or doped materials from each other in structure 100. TI(s) 108 may be formed by forming trenches (not shown) within monocrystalline semiconductor and filling such trenches with an insulating material such as oxide, to isolate various materials within monocrystalline semiconductor from another. TI(s) 108 may include various insulating materials, oxide and/or nitride insulators. According to one example, two portions of TI 108 material are shown, with other portions of TI 108 horizontally surrounding structure 100 as shown in FIG. 2 and discussed elsewhere herein.

Semiconductor layer 106 may include multiple emitter/collector (E/C) regions 110 therein, i.e., regions of semiconductor material having the same semiconductor composition but a different dopant polarity and/or concentration than that of semiconductor layer 106. A first E/C region 110a may be within monocrystalline semiconductor and may be adjacent TI 108. A second E/C region 110b also may be within monocrystalline semiconductor and may be adjacent another TI 108 or portion thereof. A portion of semiconductor layer 106 horizontally between E/C regions 110a, 110b may define an intrinsic base 111 having a different doping polarity from E/C regions 110a, 110b. Thus, E/C regions 110a, 110b may have an opposite doping polarity from that of semiconductor layer 106 and intrinsic base 111 and may have a higher concentration of dopants therein. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter (cm 2) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$.

Regarding doping type and concentrations, E/C regions 110a, 110b may be doped p-type or n-type, and in one example may be doped p-type. In this case, intrinsic base 111 is oppositely doped n-type. The doping concentration of E/C regions 110a, 110b may be higher than that of semiconductor layer 106 and intrinsic base 111. Nonetheless, intrinsic base 111 and E/C regions 110a, 110b together define the three alternating polarity doped regions of a lateral bipolar transistor 112 in structure 100.

Lateral bipolar transistor 112 may include additional materials on E/C regions 110a, 110b to increase conductivity between the terminals defined within E/C regions 110a, 110b and interconnected structures. Specifically, E/C silicides 113a, 113b may be formed to E/C regions 110a, 110b. Silicides 113a, 113b may be formed by forming various conductive materials on conductive or other active semiconductor materials such as those within E/C regions 110a, 110b, e.g., by depositing a layer of conductive metal, annealing the conductive metal such that it migrates into underlying material(s), and removing excess metal(s) after the annealing concludes. Each silicide 113a, 113b may include any currently known or later developed conductive material configured for reacting with semiconductor to form a silicide material, e.g., copper (Cu), aluminum (Al), Nickel (Ni) etc. Structure 100 additionally may include E/C conductors 114a, 114b over E/C regions 110a, 110b, respectively, for coupling of overlying metal wires and vias to lateral bipolar transistor 112. E/C conductors 114a, 114b may include Cu, Al, Ni, and/or other currently known or later developed metal wiring materials, such materials possibly formed by removing of overlying insulator(s) and depositing conductive metal(s) over E/C regions 110a, 110b.

Figure 3:
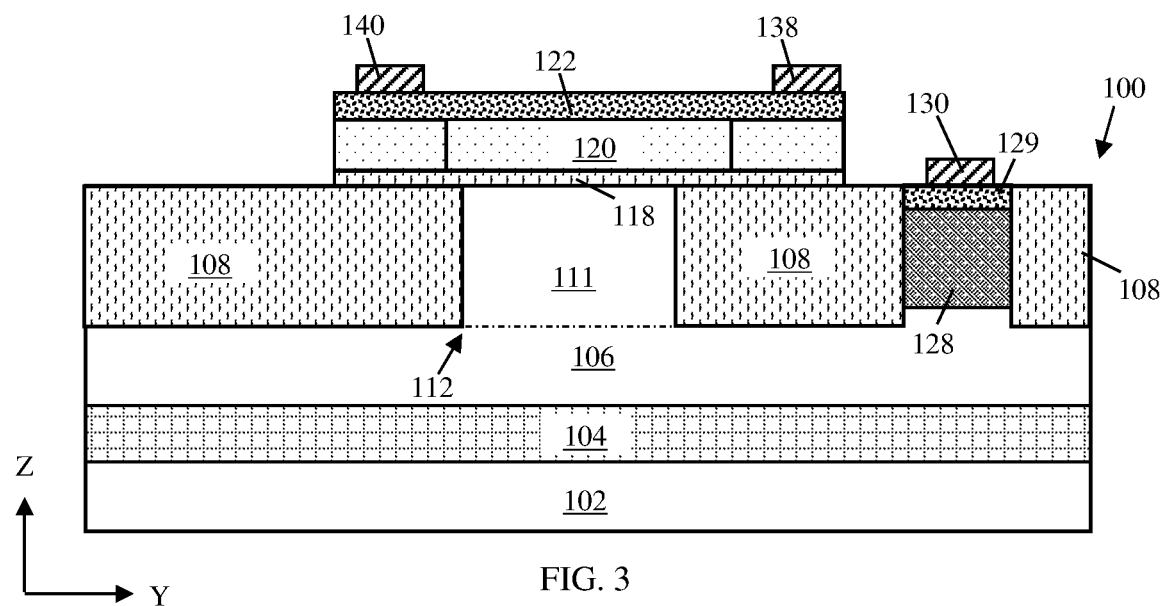
FIG. 3 depicts a second cross-sectional view in plane Y-Z of a structure according to embodiments of the disclosure.

Referring to FIGS. 1-3 together, in which FIG. 2 provides a plan view of structure 100 and FIGS. 1 and 3 provide cross-sections along view lines 1-1 and 3-3 of FIG. 2, respectively, embodiments of the disclosure provide an electrically programmable fuse (efuse) structure 116 over lateral bipolar transistor 112. Efuse structure 116 can be formed, e.g., in polycrystalline semiconductor and/or similar materials otherwise used to form the gate structure of a bipolar transistor or metal oxide semiconductor field effect transistor (MOSFET). For example, a structure 100 may include a gate dielectric layer 118 on a portion of intrinsic base 111 over lateral bipolar transistor 112, and horizontally between E/C regions 110a, 110b. Gate dielectric layer 118 may include, e.g., a dielectric layer with a high dielectric constant ("high-k," indicating a k value of at least approximately 3.9) or any other layer of suitable gate dielectric material (e.g., SiO2, etc.) and may have a smaller vertical thickness than resistive semiconductor material 104 in some implementations. In various implementations, gate dielectric layer 118 may have a vertical thickness as small as approximately 3.0 nm or may have a larger thickness of, e.g., approximately 40 nm. The thickness of gate dielectric layer 118 may be of any size sufficient to electrically isolate efuse structure 116 from lateral bipolar transistor 112 thereunder.

A polycrystalline semiconductor layer 120 may be on gate dielectric layer 118 such that gate dielectric layer 118 is vertically between lateral bipolar transistor 112 and polycrystalline semiconductor layer 120. An efuse silicide 122 including, e.g., any currently known or later developed semiconductor-metal composition such as those discussed herein relative to E/C silicides 113a, 113b may be on polycrystalline semiconductor layer 120. Silicides 113a, 113b, 122 do not appear in FIG. 2 solely for clarity of illustration. Efuse structure 116 further may include a set of spacers 124 on sidewalls of gate dielectric layer 118 and polycrystalline semiconductor layer 120. Spacers 124 may have the same composition and/or similar compositions to other insulative materials discussed herein and may prevent conductive pathways from forming to any components that are adjacent to efuse structure 116. Structure 100 additionally may include, e.g., a separating insulator 126 over semiconductor layer 106 and horizontally between efuse structure 116 and E/C layer 110b (or E/C layer 110a in alternative implementations). Separating insulator 126 may include any of the insulating material(s) operable for use within TI(s) 108 and/or spacer(s) 124 or may include any other conceivable insulating material.

Separating insulator 126, however embodied, may be a horizontal width (i.e., along the X-axis direction as shown in FIGS. 1, 2) sufficient to prevent electrical biasing of polycrystalline semiconductor layer 120 from defining a channel region between E/C regions 110a, 110b. Hence, separating insulator 126 may be included within structure 100 to prevent a FET from being formed from the compositions of lateral bipolar transistor 112 and efuse structure 116 thereover. Separating insulator 126 may be sized such that separation distance S is larger than a corresponding separation between efuse structure 116 and E/C region 110a, opposite separating insulator 126. Separating insulator 126 in various embodiments may have a horizontal width sufficient for separation distance S to be, e.g., between approximately 0.1 micrometers (μm) and approximately 0.5 μm. In such an example, the corresponding horizontal separation between efuse structure 116 and E/C region 110a may be approximately zero μm, and therefore less than separation distance S.

Referring specifically to FIGS. 2 and 3, lateral bipolar transistor structure 112 may include additional components to control current flow between E/C regions 110a, 110b through intrinsic base 111 without affecting efuse structure 116 thereover. For example, bipolar transistor structure 112 may include an extrinsic base 128 that is coupled to intrinsic base region 111, e.g., through a portion of semiconductor layer 106. Extrinsic base 128 may have the same doping type as intrinsic base 111 but in a substantially higher concentration to provide a more highly conductive region for control of bipolar transistor structure 112. Thus, extrinsic base 128 may be doped n-type in the case where intrinsic base 111 is also doped n-type. A base silicide 129 may be on extrinsic base 128 and may include the same material and/or similar material to silicides 113a, 113b, 122 discussed elsewhere herein. A base contact 130, e.g., including any conductor materials discussed herein, may be on base silicide 129 to couple extrinsic base 128 to other components through overlying metal wires or vias. A portion of semiconductor layer 106 may extend horizontally below STI(s) 108 to provide an electrical pathway from intrinsic base 128 to intrinsic base 111 of lateral bipolar transistor 112.

Figure 4:
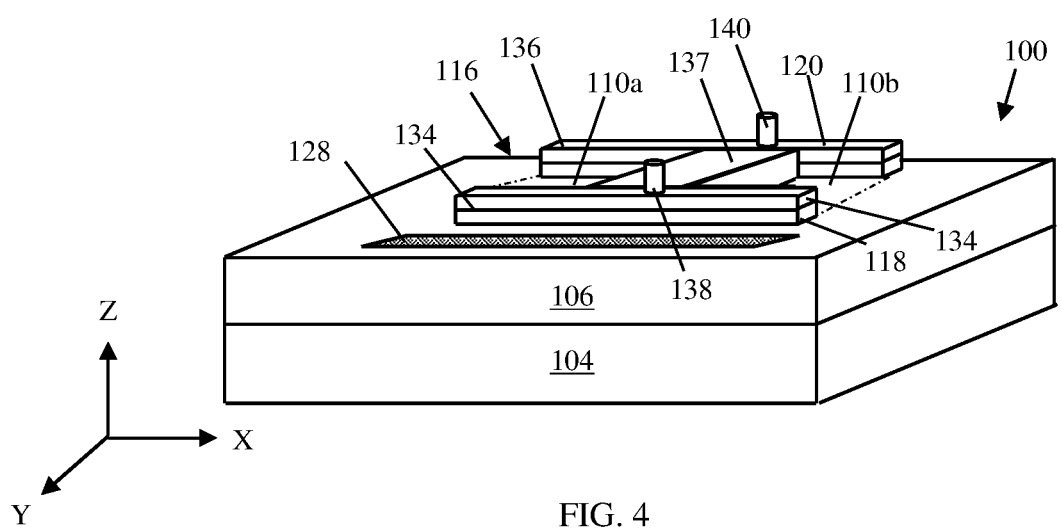
FIG. 4 depicts a perspective view of a structure according to embodiments of the disclosure.

Referring briefly to FIG. 4, a perspective view of structure 100 with efuse structure 116 over lateral bipolar transistor 112 is shown. The perspective view of efuse structure 116 is provided to illustrate additional details of efuse structure 116. Efuse structure 116 may be substantially I-shaped in plane X-Y, in which polycrystalline semiconductor layer 120 may include an anode 134 coupled to a cathode 136 through a fuse link 137. Fuse line 137 may be substantially smaller in horizontal width than anode 134 and/or cathode 136. An anode contact 138 may couple anode 134 to metal wires and/or vias in overlying metal level layers, and a cathode contact 140 similarly may couple cathode 136 to metal wires and/or vias in overlying metal level layers.

Initially, current may pass from anode 134 to cathode 136 through fuse link 137 of efuse structure 116 without significant impedance. The passage of current through lateral bipolar transistor structure 112 below efuse structure 116, however, may impart thermal energy to fuse link 137, thereby destroying fuse link 137 when a minimum current imparts sufficient heat to destroy fuse link 137. Fuse link 137 may be destroyed in this case without any effect on anode 134 or cathode 136, e.g., due to fuse link 137 being narrower in size and located directly over the current pathway through lateral bipolar transistor 112. Thus, efuse structure 116 is capable of being programmed through the operation of lateral bipolar transistor 112.

Figure 5:
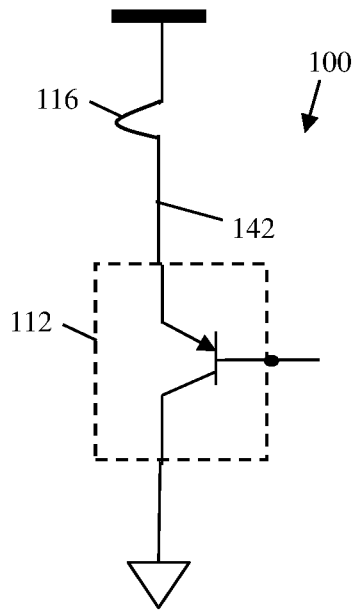
FIG. 5 depicts a schematic diagram of a circuit implemented using a structure according to embodiments of the disclosure.

Referring to FIGS. 2 and 5 together, in which FIG. 5 depicts a schematic view of a circuit provided in structure 100, embodiments of the disclosure may connect lateral bipolar transistor 112 to efuse structure 116 together in series. For example, a metal wire 142 may couple E/C contact 114b to anode contact 138, thereby coupling one of E/C regions 110a, 110b of lateral bipolar transistor 112 to anode 134 of efuse structure 116. In this configuration, as shown in FIG. 5, enabling or disabling current flow through lateral bipolar transistor 112 may also control whether current may pass through efuse structure 116. Thus, applying a threshold current to extrinsic base 128 thus may simultaneously enable current passage from emitter to collector of lateral bipolar transistor 112, and programming of efuse structure 116 by destroying fuse link 137.

Figure 6:
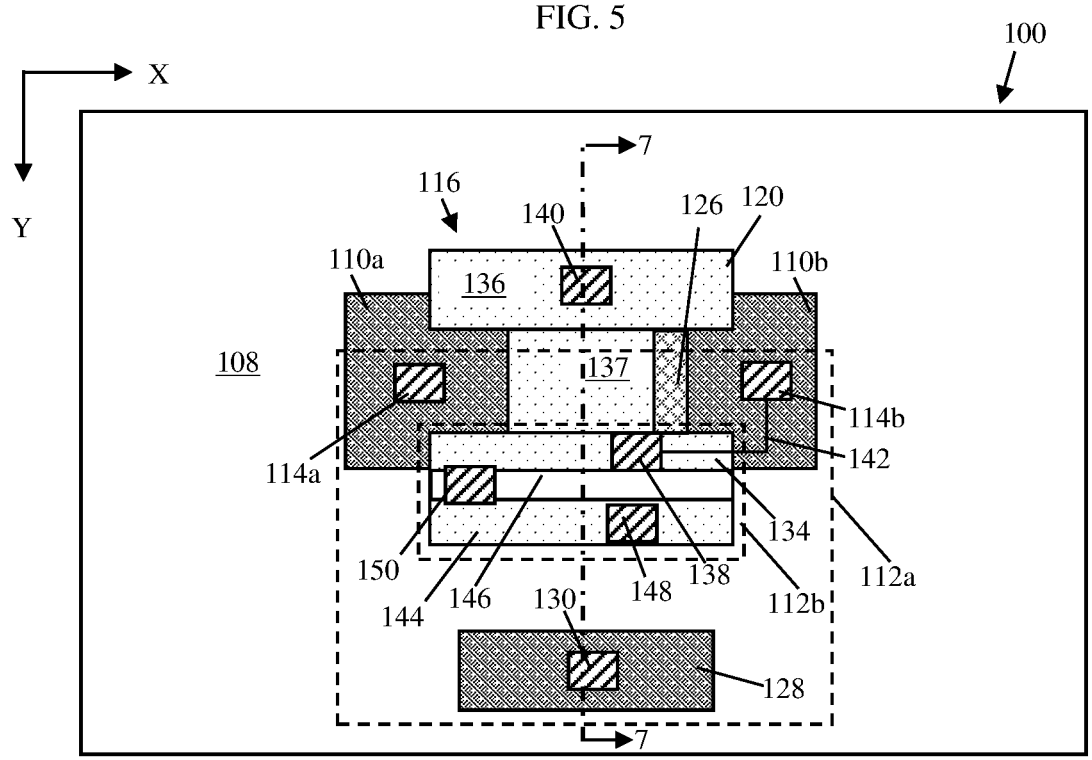
FIG. 6 depicts a plan view in plane X-Y of a structure with multiple bipolar transistors according to embodiments of the disclosure.
Figure 7:
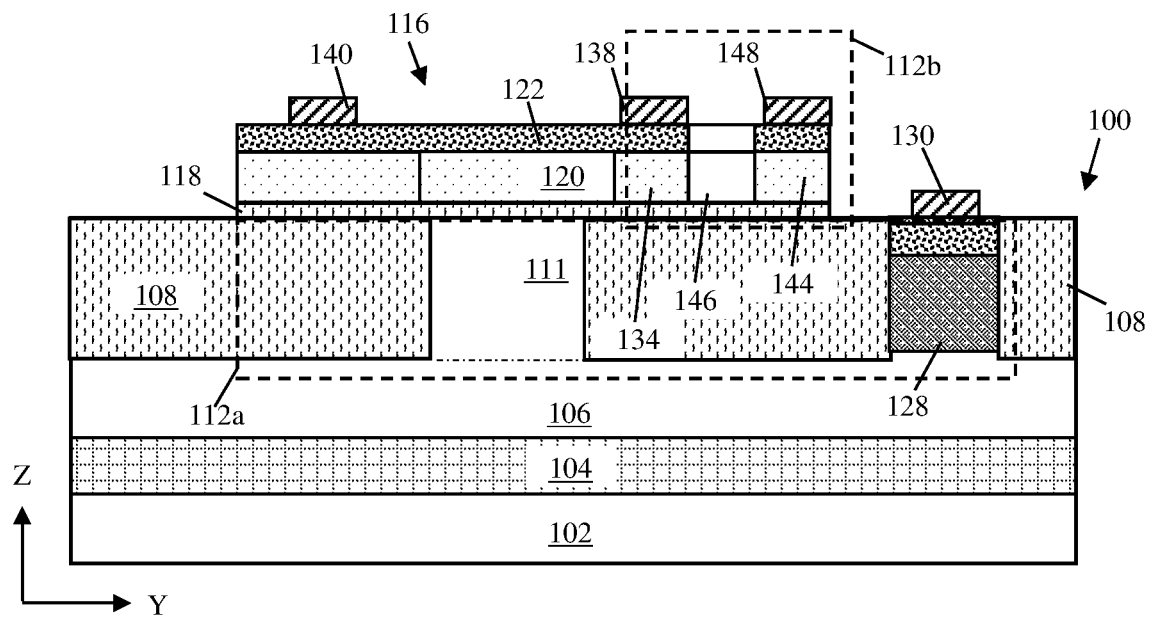
FIG. 7 depicts a cross-sectional view in plane Y-Z of a structure with multiple bipolar transistors according to embodiments of the disclosure.
Figure 8:
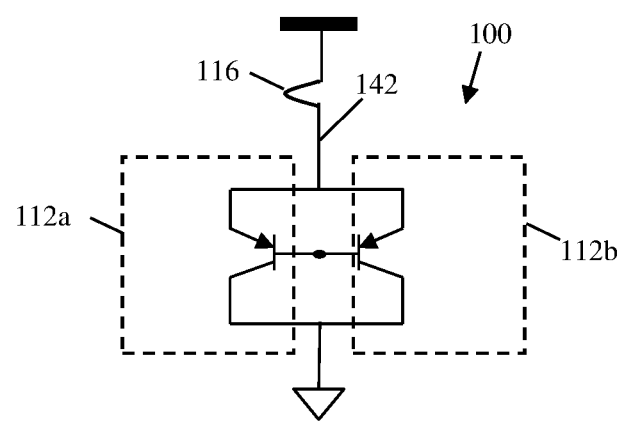
FIG. 8 depicts a schematic diagram of a circuit with multiple bipolar transistors implemented using a structure according to embodiments of the disclosure.

FIGS. 6-8 depict further implementations of structure 100 including multiple lateral bipolar transistor structures (separately referred to as first lateral bipolar transistor 112a, second lateral bipolar transistor 112b) with efuse structure 116. First lateral bipolar transistor 112a may be defined within semiconductor layer 106 as discussed elsewhere herein. However, second lateral bipolar transistor 112b may be defined at least partially within polycrystalline semiconductor layer 120 and thus may be horizontally adjacent efuse structure 116. First lateral bipolar transistor 112a may be within semiconductor layer 106 and may be structured similarly or identically to lateral bipolar transistor 112 (FIGS. 1-5) of structure 100 according to other implementations discussed herein. Second lateral bipolar transistor 112b, by contrast, may be formed within polycrystalline semiconductor layer 120 and over semiconductor layer 106. Anode 134 of efuse structure 116 may simultaneously define an emitter or collector of second lateral bipolar transistor 112b. A polycrystalline E/C region 144 may be horizontally separated from anode 134 by a polycrystalline base 146. An overlying E/C contact 148 may be on efuse silicide 122 over polycrystalline E/C region 144, and an overlying base contact 150 (FIG. 6 only) may be over polycrystalline base 146 to control passage of current from polycrystalline E/C region 144 to anode 134.

Referring specifically to FIG. 8, lateral bipolar transistors 112a, 112b each may be coupled in parallel to the anode terminal of efuse structure 116 through metal wire 142. In this configuration, the use of multiple lateral bipolar transistors 112a, 112b may accommodate larger amounts of current than would be possible with only one lateral bipolar transistor 112. This advantage may be especially pronounced, e.g., when polysilicon base 146 and extrinsic base 128 are coupled to a shared node. Optionally, only one of the two lateral bipolar transistors 112a, 112b may be in thermal communication with efuse structure 116 to allow programming of efuse structure 116 by heating of fuse link 137.

Embodiments of the disclosure provide various technical and commercial advantages, examples of which are discussed herein. Providing an efuse structure over a lateral bipolar transistor, in addition to reducing the surface area required to provide both devices, allows the lateral bipolar transistor to affect programming of the efuse structure. The lateral bipolar transistor, by being located underneath the efuse structure, can be in thermal communication with the efuse to heat the fuse link. Thus, the lateral bipolar transistor structure can control programming of the efuse structure under desired operational circumstances. The physical distance between the efuse structure and the emitter or collector terminal of the bipolar transistor, in addition, prevents a FET or other structure from inadvertently forming on a device layer where the efuse structure and lateral bipolar transistor are provided.

In the description of the structure embodiments above, reference is made to semiconductor features including, but not limited to, substrates, layers, regions, portions, terminals, etc. and to the conductivity types (e.g., P-type or N-type) of those features. Such features are made up of one or more semiconductor materials and a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve the different conductivity types (e.g., P-type conductivity and N-type conductivity) and the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in each semiconductor region.

The terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a lateral bipolar transistor within a semiconductor layer and over a substrate;
   an insulator layer over a portion of the semiconductor layer, wherein a separation distance between an emitter of the lateral bipolar transistor and a first sidewall of the insulator layer is larger than a separation distance between a collector of the lateral bipolar transistor and a second sidewall of the insulator layer; and
   an electrically programmable fuse (efuse) structure within a polycrystalline semiconductor layer and over the insulator layer, wherein the efuse structure is over a current path through the lateral bipolar transistor, and the insulator layer electrically isolates the efuse structure from the current path.

2. The structure of claim 1, wherein the separation distance between the emitter of the lateral bipolar transistor and the first sidewall of the insulator is between approximately 0.1 micrometers (μm) and approximately 0.5 μm.

3. The structure of claim 1, further comprising a resistive semiconductor material vertically between the substrate and the semiconductor layer.

4. The structure of claim 1, wherein an emitter of the lateral bipolar transistor is coupled to one of an anode and a cathode of the efuse structure.

5. The structure of claim 1, wherein the insulator layer includes a high-k gate dielectric material.

6. The structure of claim 1, wherein the semiconductor layer includes a monocrystalline semiconductor.

7. A structure comprising:
   a crystalline semiconductor layer over a substrate;
   a lateral bipolar transistor defined within the crystalline semiconductor layer;
   an insulator layer over a portion of the crystalline semiconductor layer, wherein a separation distance between an emitter of the lateral bipolar transistor and a first sidewall of the insulator layer is larger than a separation distance between a collector of the lateral bipolar transistor and a second sidewall of the insulator layer;

a polycrystalline semiconductor layer on the insulator layer; and an electrically programmable fuse (efuse) structure defined within the polycrystalline semiconductor layer and over the insulator layer, wherein a vertical thickness of the insulator layer electrically isolates the efuse structure and the lateral bipolar transistor, and wherein the efuse structure is over a current path through the lateral bipolar transistor.

8. The structure of claim 7, wherein the separation distance between the emitter of the lateral bipolar transistor and the first sidewall of the insulator layer is between approximately 0.1 micrometers (μm) and approximately 0.5 μm.

9. The structure of claim 7, further comprising a resistive semiconductor material vertically between the substrate and the crystalline semiconductor layer.

10. The structure of claim 7, wherein an emitter of the lateral bipolar transistor is coupled to one of an anode and a cathode of the efuse structure.

11. The structure of claim 7, wherein the insulator layer includes a high-k gate dielectric material.

12. A structure comprising:
a first lateral bipolar transistor within a semiconductor layer and over a substrate;
an insulator layer over a portion of the semiconductor layer, wherein a separation distance between an emitter of the first lateral bipolar transistor and a first sidewall of the insulator layer is larger than a separation distance between a collector of the first lateral bipolar transistor and a second sidewall of the insulator layer;
a second lateral bipolar transistor within a polycrystalline semiconductor layer and over the insulator layer; and
an electrically programmable fuse (efuse) structure within the polycrystalline semiconductor layer and over the insulator layer, wherein a cathode of the efuse structure is adjacent one of an emitter and a collector of the second lateral bipolar transistor, and the efuse structure is over a current path through the first lateral bipolar transistor, and the insulator layer electrically isolates the efuse structure from the current path.

13. The structure of claim 12, wherein the separation distance between the emitter of the first lateral bipolar transistor and the first sidewall of the insulator layer is between approximately 0.1 micrometers (μm) and approximately 0.5 μm.

14. The structure of claim 12, further comprising a resistive semiconductor material vertically between the substrate and the semiconductor layer.

15. The structure of claim 12, wherein one of an anode and a cathode of the efuse structure is coupled to each of the first lateral bipolar transistor and the second lateral bipolar transistor.

16. The structure of claim 12, wherein the insulator layer includes a high-k gate dielectric material.

17. The structure of claim 12, wherein the semiconductor layer includes a monocrystalline semiconductor.

* * * * *